United States Patent [19]

Burnham et al.

[11] Patent Number: 4,659,979
[45] Date of Patent: Apr. 21, 1987

[54] HIGH VOLTAGE CURRENT SOURCE CIRCUIT AND METHOD

[75] Inventors: Stephen R. Burnham, Tucson, Ariz.; Stephen F. Ulbrich, Manitou Springs, Colo.

[73] Assignee: Burr-Brown Corporation, Tucson, Ariz.

[21] Appl. No.: 802,709

[22] Filed: Nov. 27, 1985

[51] Int. Cl.⁴ ............................................... G05F 3/08
[52] U.S. Cl. .................... 323/312; 323/270; 307/302; 307/303; 357/20; 357/35
[58] Field of Search ........ 323/268, 270, 312, 315–316; 307/296 R, 302, 303; 357/20, 34–35

[56] References Cited

U.S. PATENT DOCUMENTS 3,160,807 12/1964 Packard ............................. 323/270
3,858,062 12/1974 Davis ............................. 323/312 X
3,996,498 12/1976 Schade, Jr. ..................... 323/315 X
4,306,185 12/1981 Leuschner ........................ 323/312

Primary Examiner—Peter S. Wong
Attorney, Agent, or Firm—Cahill, Sutton & Thomas

[57] ABSTRACT

A high voltage constant current source circuit includes first transistor biased as a constant current source and a second transistor connected in series with the first transistor. The second transistor has a punch-through voltage that is substantially less than any breakdown voltage of the second transistor. The emitter of the second transistor is connected to the collector of the first transistor. The collector of the second transistor supplies the constant current, provides an increased high output impedance, and allows low voltage operation if the collector-to-emitter voltage of the second transistor is less than its punch-through voltage. If its punch-through voltage is exceeded, that punch-through voltage adds to the collector-to-emitter breakdown voltage of the first transistor, allowing high voltage operation.

19 Claims, 9 Drawing Figures

U.S. Patent   Apr. 21, 1987   Sheet 1 of 3   4,659,979
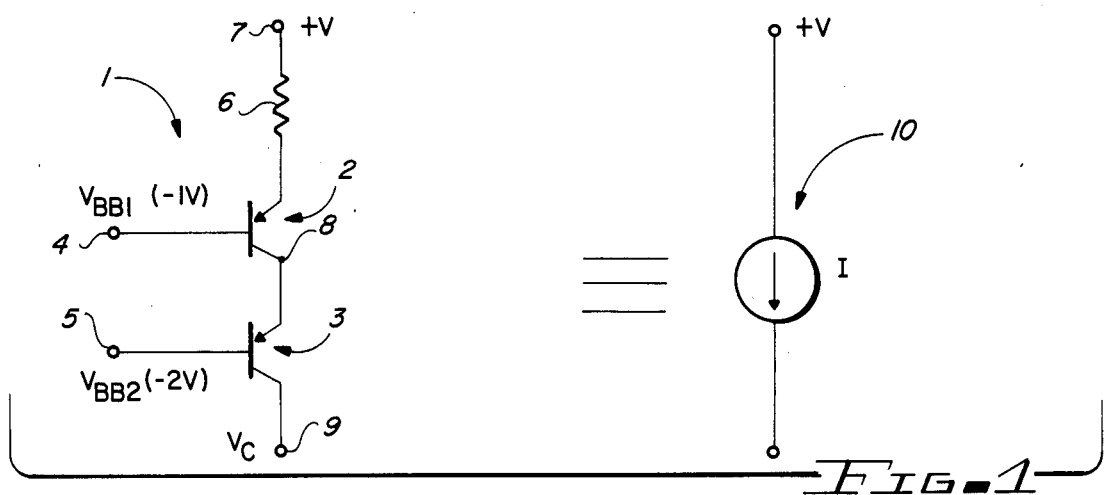
_Fig-1_
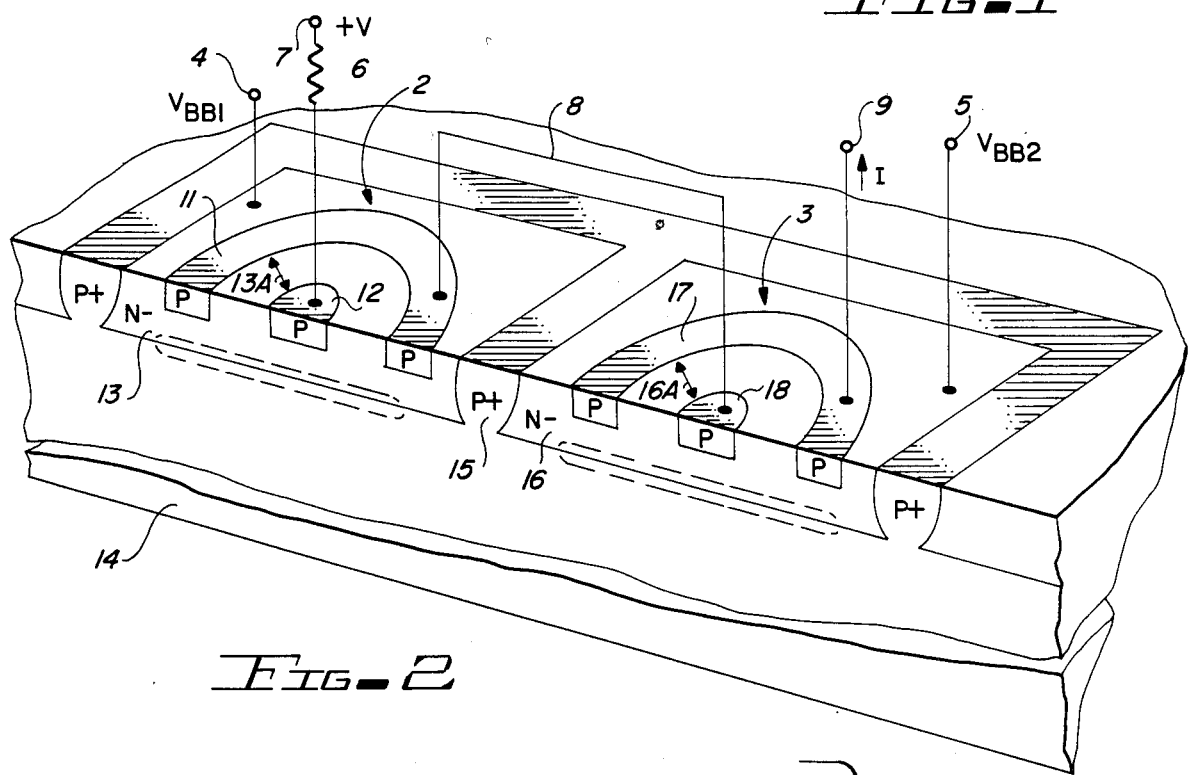
_Fig-2_
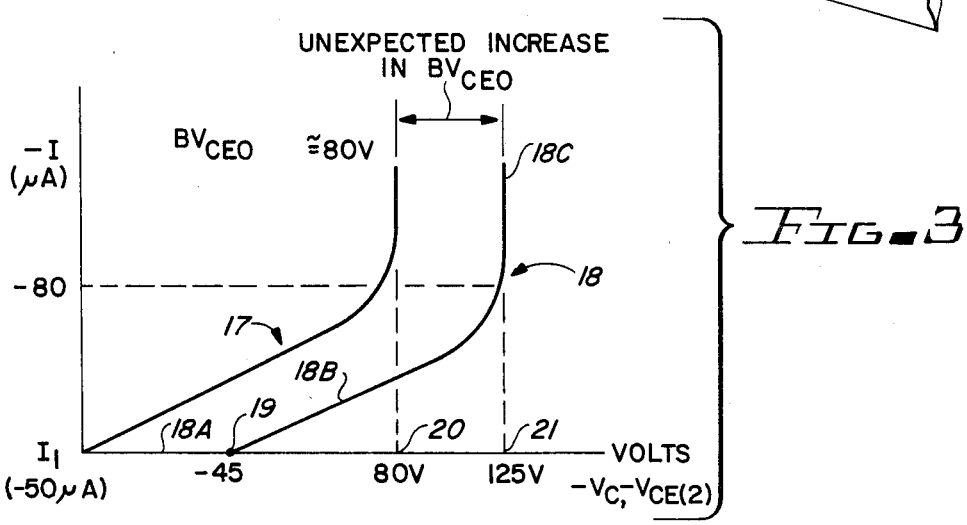
_Fig-3_

HIGH VOLTAGE CURRENT SOURCE CIRCUIT AND METHOD

BACKGROUND OF THE INVENTION

The invention relates to high voltage current source circuits, and particularly to high voltage current source circuits that include bipolar transistors operating in their punch-through modes, and even more particularly to high voltage current source circuits that function as current sources from a positive supply voltge conductor.

It is well known that bipolar transistors ordinarily should not be operated in their various collector breakdown modes. The collector-to-emitter breakdown voltage $BV_{CEO}$ (base open circuited), $BV_{CES}$ (base electrode shorted to the emitter), and the collector-base breakdown voltage $BV_{CBO}$ (emitter open circuited) are well known and have been widely described in the literature. It is also known that bipolar transistors can be designed to operate in their "punch-through" modes. In the "punch-through" mode, the collector-base reverse bias voltage is increased to the point at which the portion of the depletion region of that junction within the base region extends all the way to the emitter-base junction. The punch-through voltage of bipolar transistors has been widely discussed and analyzed in the literature. Only if the magnitude of the punch-through voltage $V_{PT}$ is less than or equal to the lower of the breakdown voltage $BV_{CES}$ or $BV_{CEO}$ does "punch-through" of the transistor occur. Ordinarily, bipolar transistors are designed or selected so that collector-to-emitter breakdown and collector-base breakdown are avoided during normal circuit operation. However, the collector-to-emitter punch-through voltage has, on occasion, been used to advantage in some circuits. For example, U.S. Pat. No. 3,571,630 shows a regulator circuit in which the transistor operates in its punch-through mode to serve as a voltage reference.

High voltage circuits, such as high voltage, high power operational amplifiers, frequently need to include high voltage constant current source circuits that operate properly when subjected to very high supply voltages. For certain high power, high voltage bipolar operational amplifiers, lateral PNP current sources connected to the positive power supply have been widely used. Such constant current source circuits are commonly of the "current mirror" variety and are composed of matched lateral PNP transistors. The circuitry to which the constant currents are supplied by such lateral PNP transistor current mirror circuits may vary widely, sometimes increasing collector voltage of a lateral PNP transistor enough to cause breakdown of that lateral PNP transistor. This condition is very undesirable, because it can change the bias voltage supplied not only to the lateral PNP transistor undergoing breakdown, but to all other current source transistors biased by the same voltage. This situation would probably result in total inoperability of the integrated circuit.

Since lateral PNP transistors and integrated circuits do not have nearly as high breakdown voltages as vertical NPN transistors normally fabricated on the same semiconductor chips, the breakdown voltages of lateral PNP transistors often are the limiting factors in determining the maximum magnitudes of the power supply voltages applied to integrated circuits.

Another shortcoming of lateral PNP constant current source current mirrors has been the fact that their collector or output impedances have not been as high as would be desirable, due to the inherently low gain of lateral PNP transistors. In order to increase the output impedance of the lateral PNP constant current source circuits, it is known to add a second lateral PNP transistor in "cascode" connection to the first one, connecting the emitter of the second lateral PNP transistor to the collector of the first one, and appropriately biasing the base of the second lateral PNP transistor. This greatly increases the output impedance of the collector of the second lateral PNP transistor, which then supplies the desired constant current. Such cascode circuits do not, however, significantly increase the breakdown voltage of the resulting circuit.

Although it would be possible to insert a zener diode between the collector of a conventional lateral PNP constant current source and the circuit to which the constant current is supplied, reducing the voltage applied across the collector-base junction and the voltage applied between the emitter and collector terminals of the lateral PNP transistors, this would preclude the possibility of operating the integrated circuit at low voltages and would limit the range of voltage levels the circuit requiring the constant current is allowed to have, for example, common-mode swing of an input amplifier. It is highly desirable that integrated circuits designed to have the capability of high voltage operation also be able to operate effectively when low power supply voltages are applied, and not have overly restricted internal voltage ranges.

There remains an unmet need for a means of increasing the breakdown voltage of a lateral PNP constant current source transistor in a conventional integrated circuit.

SUMMARY OF THE INVENTION

Accordingly, it is an object of the invention to provide an inexpensive, constant current source circuit of simple construction and capable of operating at very high voltages and supplies current from the positive power supply.

It is another object of the invention to provide a stable, simple, high voltage constant current circuit that is composed of lateral PNP transistors and can be easily fabricated in a typical bipolar integrated circuit manufacturing process.

It is another object of the invention to provide an economical, high voltage, lateral PNP constant current source that can be operated not only at high voltages, but also at low voltages, and which provides increased output impedance at low voltage operation.

BRIEF DESCRIPTION OF THE DRAWINGS

FIG. 1 is a schematic circuit diagram of the present invention.

FIG. 2 is a partial perspective section view of one implementation of the circuit shown in FIG. 1.

FIG. 3 is a graph useful in illustrating the operation of the circuit of FIG. 1.

DESCRIPTION OF THE INVENTION

Figure 7:
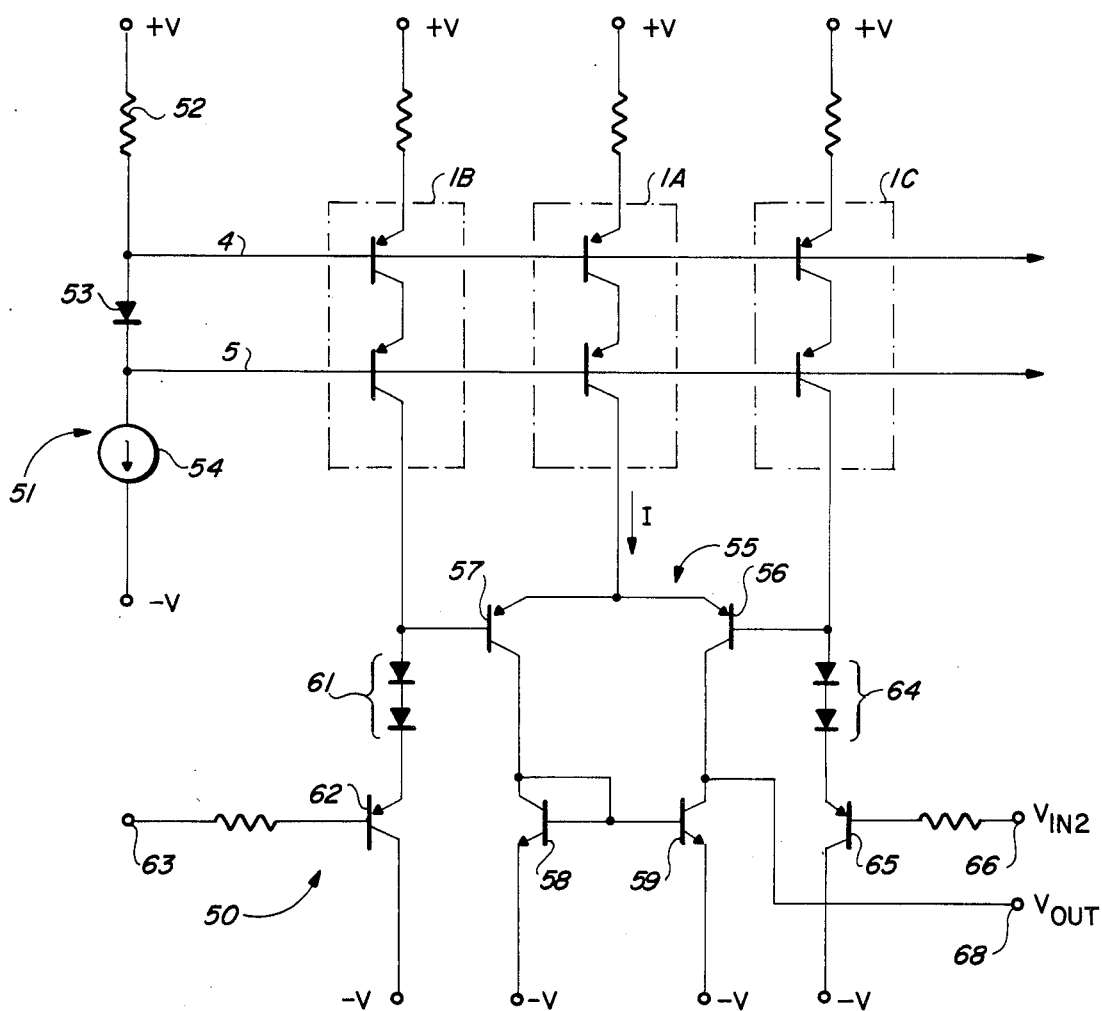
FIG. 7 is a circuit schematic diagram of a high voltage differential amplifier circuit in which the constant current source circuit of FIG. 1 is utilized.

Referring now to the drawings, particularly FIG. 1, reference numeral 1 designates a high voltage current source circuit of the present invention. High voltage current source 1 includes a lateral PNP transistor 2 having its emitter connected by an emitter resistor 6 to a positive supply voltage conductor 7, on which a voltage +V is applied. (The resistance of emitter resistor 6 is about 4 kilohms.) The base of lateral PNP transistor 1 is connected to a conductor 4, to which a base bias voltage $V_{BB1}$ is applied. The collector of transistor 2 is connected by conductor 8 to the emitter of a second lateral PNP transistor 3. The base of lateral PNP transistor 3 is connected to conductor 5, on which a second base bias voltage $V_{BB2}$ is applied. The collector of transistor 3 is connected to a conductor 9, through which a constant current I is supplied to a receiving circuit, for example as shown in FIG. 7.

As indicated by the constant current source symbol designated by reference numeral 10 in FIG. 1, the current source circuit 1 operates as a constant current source.

It should be appreciated that the circuit of FIG. 1, as schematically drawn with no limitations on the structure of lateral PNP transistor 3, is a circuit that is known in the prior art. PNP transistor 3 is said to be in a "cascode" connection with PNP transistor 2, and is provided to increase the collector impedance at conductor 9 to a much higher value than the collector impedance at conductor 8. In the known circuit, when implemented in monolithic form, both lateral PNP transistors 2 and 3 have essentially the same base widths, and neither is designed to go into punch-through operation during normal circuit operation. Instead, the various breakdown voltages such as $BV_{CEO}$, $BV_{CBO}$, etc., are all less than the punch-through voltage established by the base width, and punch-through operation is impossible.

However, in accordance with the present invention, the lower lateral PNP transistor 3 operates in its punch-through mode if the difference between its emitter and collector voltages exceeds a predetermined level, for example, about 45 volts.

In accordance with the present invention, it has been found that the allowable difference between +V and $V_C$ is greatly increased by deliberately designing lateral PNP transistor 3 to operate in its punch-through mode.

This is believed to be a suprising result, because ordinarily, circuit designers consider punch-through of a transistor as a condition to be avoided. It is a rare circumstance in the design of integrated circuits wherein punch-through operation of a transistor can be useful. In the circuit of FIG. 1, use of punch-through operation of transistor 3, first allows "ordinary" operation of the circuit as a constant current source with very high output impedance if the voltage difference between $V_C$ and +V is less than a predetermined voltage (typically about 45 volts), so that the impedance at conductor 9 (looking into the collector of transistor 3) is very high, and second results in satisfactory operation of the circuit as a constant current source, although with reduced output impedance, if the difference between +V and $V_C$ exceeds that predetermined voltage. If +V is equal to 0 volts, then the voltage $V_C$ on conductor 9 can be as low as about −125 volts without causing large bias currents to be produced in either conductor 4 or 5, which would usually cause numerous other problems in the operation of an integrated circuit.

The basic structure, excluding the metalization layers, of the circuit of FIG. 1, as implemented in an integrated circuit, is shown in FIG. 2. Lateral PNP transistor 2 is fabricated in an N-type epitaxial region 13 that is isolated from an N-type epitaxial region 16 in which transistor 3 is fabricated. The P-type collector of lateral PNP transistor 2 is a generally annular, closed P-type region 11 formed in N-type base region 13. A P-type emitter region 12 is formed within the N-type region surrounded by annular collector region 11. As indicated in FIG. 1, conductors 4 and 8 are connected to the base and collector, respectively, of lateral PNP transistor 2, and its emitter is connected by resistor 6 to +V. It is assumed that the values of doping for N-type base region 13, P-type collector 11, and P-type emitter 12 are such that the proper spacing between the emitter and collector, as designated by distance 13A in FIG. 2, is about 0.5 mils. It is also assumed, for the present example, that the doping parameters are such that the collector-to-base breakdown voltage $BV_{CBO}$ exceeds about 125 volts.

Similarly, the lateral PNP transistor 3 formed in N-type base region 16 includes an annular collector 17 surrounding and spaced from a P-type emitter region 18. The lateral spacing between the emitter 18 and the collector 17 is distance 16A, which, for the present example, is 0.4 mils. $BV_{CBO}$ of transistor 3 exceeds about 125 volts. The collector-to-emitter spacing 16A of lateral PNP transistor 3 is selected to be 0.4 mils in order cause lateral PNP transistor 3 to have a punch-through voltage of about 45 volts.

Those skilled in the art will realize that punch-through of a bipolar PNP transistor is a phenomenon wherein the depletion region of the collector expands as the base-to-collector voltage increases, until the collector depletion region extends across the base and touches the emitter. At this point, all transistor action in the base region stops, and the emitter current flows directly from the emitter to the collector. Since transistor action of transistor 3 ceases in its punch-through mode, punch-through normally is a condition to be avoided. The collector-to-emitter spacing, i.e., the base width, of bipolar transistors is normally selected to be large enough to avoid punch-through at voltages well beyond the range of collector-to-emitter voltages for which the collector breakdown voltage of the transistor are specified.

Experimental results in operating the circuit of FIGS. 1 and 2 perhaps can be understood best with reference to FIG. 3. In FIG. 3, the vertical axis designates the current −I flowing through transistors 2 and 3. The horizontal axis designates the voltage $-V_C$ on conductor 9 for curve 18 and designates the collector-to-emitter voltage $-V_{CE(2)}$ of transistor 2 for curve 17. (It should be appreciated that resistor 6 has a very low resistance so the voltage drop across it is negligible.)

The operation of transistor 2 is such that the magnitude of its collector-to-emitter voltage $V_{CE(2)}$ increases from left to right, as indicated by curve 17 in FIG. 3, to asymptotically approach its $BV_{CEO}$ voltage. Note that it is assumed that the value of $BV_{CEO}$ for transistor 2 is 80 volts and +V is 0 volts for the present example. Then, if $V_{BB1}$ is −1 volt, transistor 2 will undergo a $BV_{CEO}$ breakdown when conductor 8 is reduced to approximately −81 volts.

Next, note that the base bias voltage $V_{BB2}$ applied to conductor 5 is about −2 volts. What has been observed when $V_C$ is lowered from ground to increasingly negative values, with transistor 3 being a punch-through limited device, is that the −I versus −$V_C$ characteristic occurs as indicated by curve 18 in FIG. 3. The initial part of curve 18, designated by reference numeral 18A, results in a constant collector current of I1 (of about −50 microamperes) flowing through both transistors 2 and 3. When the voltage $V_C$ reaches a level that causes transistor 3 to go into "punch-through", at point 19 in FIG. 3, transistor action of transistor 3 ceases. The small base current flowing out of the base of transistor 3 during its normal transistor action now, during punch-through becomes a small positive current that has no relationship to transistor action. This positive current flowing into the base of punch-through transistor 3 is the reverse biased junction currents of the collector-base and emitter-base junctions.

As $V_C$ is further decreased from the punch-through voltage $V_{PT}$, indicated at point 19 in FIG. 3, until $V_C$ is approximately 125 volts below +V, the current I through transistors 2 and 3 has the values indicated by segment 18B of curve 18. The explanation for this is that base width modulation in transistor 2 gives rise to decreased output impedance, thereby increasing the collector current in transistor 2.

Figure 4:
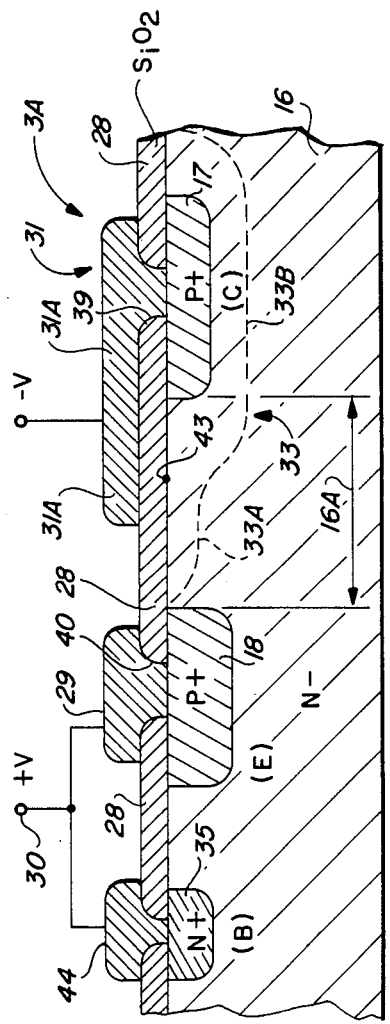
FIG. 4 is view illustrating the construction of the punch-through transistor in the circuit of FIG. 1, illustrating an advantageous field plating structure.
Figure 6C:
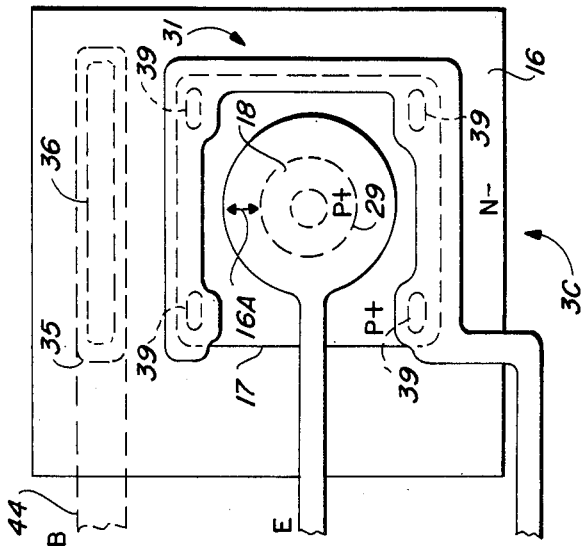
FIGS. 6A–6C illustrate the physical layout of three punch-through transistors used in testing the circuit of FIG. 1.

Segment 18C of curve 18 indicates the point at which $V_C$ has become sufficiently negative that the current I flowing through the "cascode" connection of transistors 2 and 3 becomes essentially unlimited, i.e., the point at which uncontrolled breakdown occurs. This voltage indicated by point 21 in FIG. 3, is about 125 volts for the circuit of FIG. 1 in which punch-through limited transistor 3 is implemented by a lateral PNP transistor as shown in FIGS. 4 and 6A, subsequently explained.

The fact that breakdown of the circuit of FIG. 1 can be made to occur at a much larger $V_C$ voltage (−125 volts) than the $BV_{CEO}$ voltage (−80 volts) of transistor 3 is thought to be unexpected. This is because transistor 3 normally would break down in its $BV_{CEO}$ mode at a much lower value of $V_C$, for example, at $V_C$ approximately equal to −80 volts.

A more thorough explanation of our present understanding of the operation of the constant current source circuit 1, which can be referred to as a "punch-through cascode current source", is that its operation is primarily dependent upon the following three breakdown parameters:

(1) $BV_{CEO(2)}$, which is the open-base collector-to emitter breakdown voltage of lateral PNP transistor 2.

(2) $BV_{CBO(3)}$, which is the open-emitter collector-to-base breakdown voltage of punch-through limited lateral PNP transistor 3.

(3) $BV_{PT}$, which is the punch-through limited collector-to-emitter breakdown of lateral PNP transistor 3.

For the following explanation, the term $V_{TOTAL}$ is the voltage applied between the power supply +V and conductor 9, i.e., +V −$V_C$.

First, if $V_{TOTAL}$ is less than $V_{PT}$, the "lower" PNP transistor 3 is not operating in its punch-through mode, and therefore the circuit 1 simulates an ideal current source with constant output current and very high output impedance, just as the above-described prior art cascode current source (in which punch-through limited operation of the lower PNP transistor never occurs).

If, however, $V_{TOTAL}$ is greater than $V_{PT}$, then lateral PNP transistor 3 goes into punch-through operation. In this case, the circuit 1 simulates a constant current source that is somewhat less ideal than if $V_{TOTAL}$ is less than $V_{PT}$, because all transistor action in lower PNP transistor 3 ceases, and the lower PNP transistor 3 appears as a "battery" having a voltage of $V_{PT}$ in series with the output terminal 9 and the collector of "upper" PNP transistor 2. The output impedance at terminal 9 therefore is equal to the collector impedance of upper lateral PNP transistor 2. Although the output impedance of constant current source circuit 1 is lowered when lower PNP transistor 3 goes into punch-through operation, constant current source circuit 1 still has the ability to produce a very constant output current.

It is believed that if the transistor parameters are such that $BV_{CBO(3)}$ is greater than ($BV_{CEO(2)}+V_{PT}$), then $BV_{CEO}$-type breakdown will occur in upper PNP transistor 2. In other words, this mode of operation only occurs if the $BV_{CBO}$ of lower PNP transistor 3 is so large that $BV_{CBO}$-type breakdown does not occur in lower transistor 3, forcing $BV_{CEO}$-type breakdown to occur in upper PNP transistor 2 if $V_C$ is made sufficiently negative.

If $BV_{CBO(3)}$ is less than $BV_{CEO(2)}+V_{PT}$), then no breakdown occurs in the upper lateral PNP transistor 2. However, if the lower lateral PNP transistor 3 is properly designed in accordance with the present invention, it will already be operating in its punch-through-limited $BV_{CEO}$ mode, and hence will be acting like a 45 volt battery in series with the collector of upper PNP transistor 2. Under these conditions, the base of lower lateral PNP transistor 3 will not contribute to any transistor action in PNP transistor 3, even though it will remain biased at approximately the same voltage level as it was before PNP transistor 3 went into punch-through-limited operation. As $V_{TOTAL}$ increases, i.e., as $V_C$ becomes more negative, the base-to-collector voltage of PNP transistor 3 will continue to increase, until $BV_{CBO}$-type breakdown occurs in PNP transistor 3, if $V_C$ becomes so negative that the $BV_{CBO(3)}$ is exceeded.

Our experiments have shown that by using a punch-through-limited device as shown in FIGS. 4 and 6A, the breakdown of the circuit with respect to terminals 7 and 9 can be increased without disturbing the base bias voltages in the integrated circuit. If the $BV_{CBO(3)}$ of the punch-through-limited transistor 3 can be made large enough, the breakdown of the punch-through cascode current source 1 can be made equal to the sum of $V_{PT}$ and $BV_{CEO(2)}$. If $BV_{CBO(3)}$ is not large, the breakdown of the circuit 1 becomes equal to the $BV_{CBO(3)}$ of PNP transistor 3. If $BV_{CEO(2)}$ is made sufficiently large, and $V_{PT}$ can be made reliably close (within 20 volts) to $BV_{CEO(2)}$, and if $BV_{CBO(3)}$ can be made sufficiently large, dramatically increased circuit breakdown will occur when the lateral PNP transistor 3 is a punch-through-limited device.

It is believed that if transistor 3 is properly designed, the collector depletion region, which extends all the way to the emitter during punch-through operation, connects the collector and emitter regions, allowing a depletion current flow from the emitter to the collector without having any effect on the base except that of producing a small recombination current that occurs as a result of impact ionization.

Figure 5:
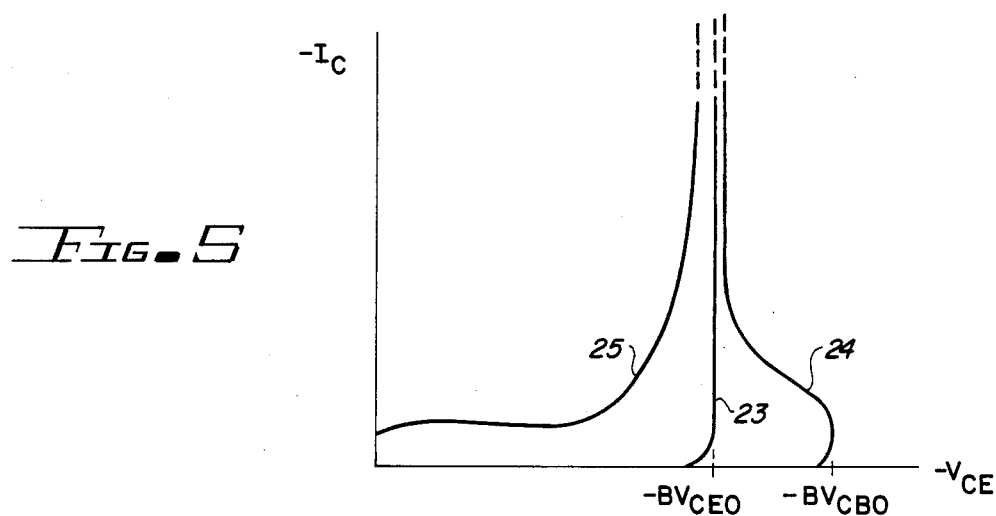
FIG. 5 a graph illustrating the collector characteristic of a typical bipolar transistor.

The proper design of punch-through limited transistor will be described in more detail with reference to FIGS. 4 and 6A–6C. First, however, it will be helpful to refer to FIG. 5, which shows the $I_C$ versus $V_{CE}$ characteristic of a typical lateral PNP transistor. In FIG. 5, reference numeral 23 designates the $BV_{CEO}$ breakdown characteristic. Curve 24 designates the $BV_{CBO}$ characteristic of a bipolar transistor. At low collector current, $BV_{CBO}$ is much higher than $BV_{CEO}$ because, with the emitter open, there is no transistor action, whereas the occurrence of $BV_{CEO}$ collector-to-emitter breakdown (with the base open) results in "beta multiplication" of the collector leakage current, which then leads to increased impact ionization and the rapid onset of avalanching as the magnitude of the collector voltage is increased, as indicated by reference numeral 23. As the collector current increases, the "$BV_{CBO}$ current 24" approaches the $BV_{CEO}$ curve, as impact ionization increases. Curve 25 in FIG. 5 indicates the collector current versus collector-to-emitter voltage if the base current flowing out of the transistor base of a PNP transistor is substantially greater than 0. This shows avalanche breakdown during normal transistor operation if the magnitude of the collector voltage becomes too large.

The initial experiments with the transistors 2 and 3 constructed essentially as shown in FIG. 2 did not produce quite the results expected. In the initial experiments, the structure of punch-through transistor 3 actually was as shown in FIG. 6C. In FIG. 6C, wherein the same or similar reference numerals are used as in FIG. 2 to designate parts of punch-through limited lateral PNP transistor 3, it can be seen that the metal layer 29 extends outwardly to the PN junction between N-type region 16 and P+ emitter region 18. It should be noted that the collector metalization layer 31 extends or "flaps" beyond the outer periphery of the P+ collector region 17 only along the outer three sides thereof, namely the top, right side, and bottom side as shown in FIG. 6C. The purpose of the "flapping" of collector metalization 31 beyond the peripheral collector base junction is to increase the $BV_{CBO}$ of punch-through transistor 3.

It was found that the original punch-through limited lateral PNP devices made in accordance with FIG. 6C, in which the base width 16A is 0.4 mils, did not reliably go into punch-through-limited operation. Instead, after some experimentation, it was found the device structure of FIG. 6A is best for producing reliable punch-through operation at a particular voltage, such as 45 volts.

In FIG. 6A, reference numeral 17 designates the generally annular P+ collector. Region 18 designates the circular P+ emitter region, reference numeral 16A designates the 0.4 mil base width, reference numeral 29 designates the emitter metalization, reference numeral 31 designates the collector metalization, reference numeral 35 designates an N+ base contact region to the N-type epitaxial base region, reference numeral 44 designates the base contact metalization, and reference numeral 36 designates an opening in the oxide allowing connection of base metalization 44 to the N+ base contact region 35. Reference numerals 39 designate openings in the oxide allowing electrical contact between the collector metalization 31 and the P+ collector ring 17. Reference numeral 40 designates an oxide opening allowing contact between the emitter metalization 29 and the P+ emitter region 18.

The distinguishing feature in FIG. 6A that provides greatly improved punch-through operation over what is obtained by the PNP transistor structure shown in FIG. 6C is the extension or "flapping" of the collector metalization layer 31 over a large portion of the "inner" portion of the collector-base junction. The structure of FIG. 6A can perhaps be better understood with reference to FIG. 4, which shows a simplified, sectional view thereof. In FIG. 4, the portion of the collector metallization 31 overlapping the collector-base junction and a portion of the base width region 16A is designated by reference numeral 31A. The SiO$_2$ layer is designated by reference numeral 28. The emitter metalization is designated by reference numeral 29.

If a relatively low voltage $-V$ is applied to collector metalization 31, as indicated in FIG. 4, and a relatively high voltage $+V$ (which could be 0 volts as in FIG. 2), is applied to both the base metalization 44 and the emitter metalization 29, dashed line 33 designates the resulting collector depletion region. Note that depletion region 33 includes a deep section that surrounds P+ collector region 17 and a shallow section 33A that extends from approximately point 43 to the P+ emitter region 18. A shallow portion 33A of depletion region 33 results from the "field effect" produced by collector metalization flapping section 31A, and the relatively low voltage thereon, extending over the portion of oxide 28 spanning the region wherein shallow depletion region 33A exists. If the "flapping" 31A of the collector metalization were not present, the collector depletion region would only extend in the region indicated by "deep" section 33B of depletion region 33, and would not reach the edge of P+ emitter region 18. Punch-through then would not reliably occur.

It has been found that the above-described collector-base junction flapping of the collector metalization is essential to causing the circuit shown in FIG. 1 to reliably produce devices exhibiting punch-through-limited breakdown voltage.

Figure 6B:
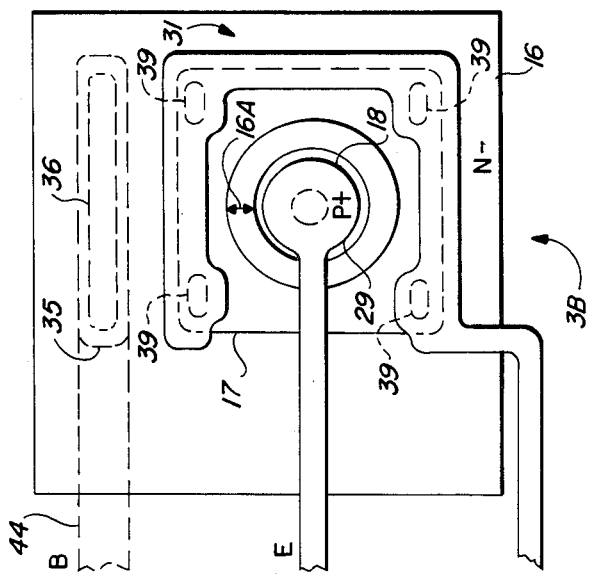
Figure 6A:
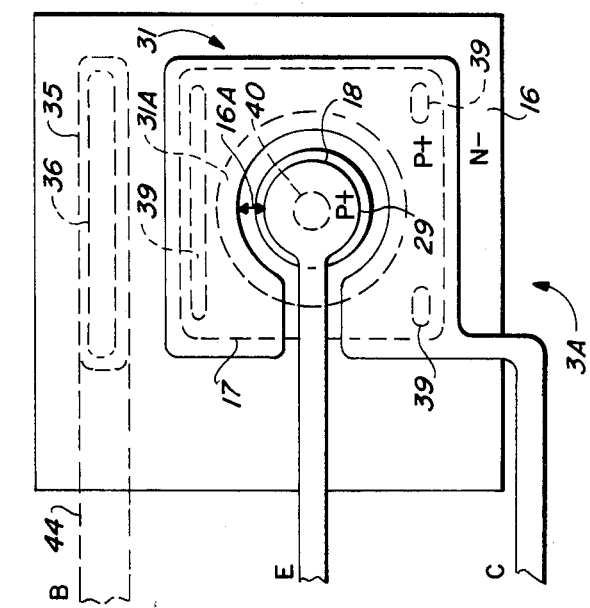

FIG. 6B designates another experimental layout of a punch-through limited lateral PNP transistor, in which no "flapping" of the collector metalization over the inner portion of the collector-base junction was provided, and in which the emitter metalization 29 did not extend to the edge of the emitter-base junction, as in FIG. 6A. Measurements of the punch-through voltages of the punch-through limited lateral PNP devices shown in FIGS. 6A, 6B, and 6C showed that the structure of FIG. 6A (also shown simplified in FIG. 4) produced a reliable, stable punch-through voltage of about 45 volts with particular diffusion parameters and 0.4 mil base width used. Neither the device shown in FIG. 6B nor the transistor of FIG. 6C produced a punch-through-limited breakdown voltage characteristic.

Next, a differential amplifier circuit 50 is illustrated in which the high voltage constant current source circuit 1 of FIG. 1 (with the punch-through transistor 3 being constructed as indicated in FIGS. 4 and 6A) is utilized. In FIG. 7, reference numeral 55 designates a PNP differential amplifier having lateral PNP input transistors 56 and 57 with their emitters connected together and to the collector of the punch-through transistor of a current source circuit 1A that is identical to constant current source circuit 1 of FIG. 1. Reference numerals 58 and 59 designate conventional load devices, which are PNP load transistors that are frequently used in this type of differential amplifier. The output voltage $V_{OUT}$ produced on conductor 68 is an amplified replica of the difference between two input voltages $V_{IN1}$ and $V_{IN2}$ applied to conductors 63 and 66, respectively.

The circuit including transistor 62 and diode 61 functions as an input voltage translator that shifts and applies $V_{IN1}$ to the base of lateral PNP transistor 57. Similarly, PNP transistor 65 and diode 64 constitute a voltage level translator that shifts and applies $V_{IN2}$ to the base of lateral PNP transistor 56. The bias currents flowing through diodes 61 (to keep that voltage level translator circuit properly biased) are provided by the constant current source circuit 1B, which is identical to the punch-through limited constant current source circuit of FIG. 1. Similarly, current source circuit 1C provides the needed bias current through the voltage translator circuit 64, 65.

FIG. 7 also shows a bias circuit 51 that performs the function of applying bias voltages to the bases of the upper PNP transistors in each of the current source circuits 1A, 1B, and 1C. Bias circuit 51 includes a resistor 52 connected between +V and the anode of a diode 53, the cathode of which is connected to a constant current source circuit 54. The anode voltage of diode 53 is applied via conductor 4 to the standard lateral PNP transistor of each of the current source circuits. The voltage on the cathode of diode 53 is applied by conductor 5 to the bases of each of the punch-through transistors of the current source circuits 1A–1C.

From the "composite" characteristic curve 18 shown in FIG. 3, it can be seen that the common mode input voltage on conductors 66 and 63 can go negative to nearly −125 volts before severe avalanching of any of the three punch-through constant current source circuits 1A–1C will occur. Furthermore, large negative common mode voltages on the differential amplifier 55 will not produce large base currents in conductors 4 or 5, thereby upsetting the bias voltages on conductors 4 and 5, and thereby further causing erroneous currents in other lateral PNP constant current source circuits that may be used in the same integrated circuit.

The described constant current source circuit of the present invention can extend the capability of higher voltage operation to many IC (integrated circuit), amplifier circuits by providing PNP constant current sources that are essentially independent of many high voltage conditions that may occur due to a variety of external influences.

Another advantage of the constant current source circuit of the present invention is that during normal operation of an integrated circuit incorporating it, wherein the punch-through transistor 3 is operating in its linear region, rather than its punch-through region, the impedance seen at conductor 9 looking into the collector of transistor 3 is much higher than the impedance seen looking into the collector of transistor 2. (Those skilled in the art will recognize that transistor 2 has a very low emitter impedance, and that the collector impedance is increased if the resistance in series with the emitter is increased.)

Thus, the constant current source circuit of the present invention provides the unexpected result of greatly increasing the high voltage operating capability by avoiding avalanche breakdown at voltages up to the punch-through voltage $V_{PT}$ plus the $BV_{CEO}$ voltage of the upper lateral PNP transistor. This advantage is obtained while also allowing low voltage operation, because the punch-through voltage $V_{PT}$ added to $BV_{CEO}$ of the upper transistor "disappears" at $V_C$ voltages below those at which the punch-through transistor 3 goes into punch-through operation. I.e., punch-through operation occurs only when needed. The rest of the time, low voltage operation is effectuated, with the additional benefit of increased impedance of the constant current source circuit at conductor 9.

While the invention has been described with reference to a particular embodiment thereof, those skilled in the art will be able to make various modifications to the described embodiment of the invention without departing from the true spirit and scope thereof. It is intended that all devices and methods that are equivalent to those described herein, in that they perform or provide substantially the same function in substantially the same way to obtain substantially the same result, are within the scope of the invention. For example, there may be various other circuits than constant current source circuits wherein a transistor may be connected to protect another transistor and then operated in its punch-through mode to prevent the other transistor from undergoing a $BV_{CEO}$ or other similar type of breakdown.

What is claimed is:

1. A constant current source circuit comprising in combination:
    (a) a first transistor having a collector, a base, and an emitter;
    (b) a second transistor having a collector, a base, and an emitter, the second transistor having a punch-through voltage $V_{PT}$ that is less in magnitude than the magnitude of $BV_{CEO}$ breakdown voltage of the second transistor;
    (c) means for coupling the emitter of the first transistor to a first supply voltage conductor and means for coupling the collector of the first transistor to the emitter of the second transistor;
    (d) means for applying a first bias voltage to the base of the first transistor to turn it on and means for applying a second bias voltage to the base of the second transistor to turn it on; and
    (e) constant current conducting means for coupling the collector of the second transistor to an external circuit to which a constant current is to be supplied.

2. The constant current circuit of claim 1 wherein the magnitude of the $BV_{CBO}$ breakdown voltage of the second transistor is greater than the sum of the magnitude of the punch-through voltage $V_{PT}$ of the second transistor and the $BV_{CEO}$ breakdown voltage of the first transistor.

3. The constant current circuit of claim 1 wherein the magnitude of the $BV_{CBO}$ voltage of the second transistor is less than the sum of the punch-through voltage $V_{PT}$ of the second transistor and the magnitude of the $BV_{CEO}$ breakdown voltage of the first transistor.

4. The constant current source circuit of claim 1 wherein the first transistor and the second transistor are of the same type.

5. The constant current source circuit of claim 4 wherein said first and second transistors are lateral PNP transistors.

6. The constant current source circuit of claim 5 wherein the base width of the second transistor is less than the base width of the first transistor.

7. The constant current source circuit of claim 6 wherein the first and second transistors are disposed in a single integrated circuit substrate.

8. The constant current source circuit of claim 7 including a plurality of constant current source circuits which are substantially similar to said constant current source circuit, and a means for coupling the first bias voltage to the bases of the first transistor of each of the constant current source circuits and means for applying the second bias voltage to the bases of the second transistor of each of the constant current source circuits.

9. The constant current source circuit of claim 7 wherein the second transistor includes an annular collector region and also includes an emitter region surrounded by and spaced from the annular collector region, and includes an oxide layer extending over the collector and emitter regions, and also including metal field plate means disposed on the oxide layer and making electrical contact to the collector of the second transistor, for extending inwardly over the oxide layer toward the emitter region to cover a substantial portion of the collector-base junction of the second transistor and to cover enough of the base region between the collector region and the emitter region to cause the collector depletion region of the second transistor to extend to the emitter region when the magnitude of the collector-to-emitter voltage of the second transistor exceeds a predetermined level.

10. The constant current source circuit of claim 9 wherein the predetermined level is approximately equal to the punch-through voltage of the second transistor.

11. The constant current source circuit of claim 9 wherein the metal field plate means extends outwardly over the oxide to cover most of the outermost portion of collector-base junction of the second transistor, thereby increasing the $BV_{CBO}$ breakdown voltage of the second transistor.

12. A constant current source circuit comprising:
(a) a first transistor having a collector, a base connected to a first bias voltage conductor, and an emitter coupled to a first supply voltage conductor;
(b) a second transistor having an emitter coupled to the collector to the first transistor, a base coupled to a second bias voltage conductor, and a collector, the second transistor having a punch-through voltage that is lower in magnitude than the $BV_{CEO}$ breakdown voltage of the first transistor; and
(c) the collector of the second transistor supplying a substantially constant current over a wide range of voltages that are less in amplitude than the sum of the punch-through voltage of the second transistor and the $BV_{CEO}$ breakdown voltage of the first transistor.

13. A method of increasing the breakdown voltage of a circuit including a first transistor, the method comprising the steps of:
(a) connecting a second transistor to the first transistor, and causing the second transistor to have a punch-through voltage that is less in magnitude than its non-punch-through limited $BV_{CEO}$ breakdown voltage; and
(b) biasing the base of the second transistor to produce a predetermined relationship between the voltages of the bases of the first and second transistors.

14. The method of claim 13 wherein the first transistor is connected in a current mirroring relationship with a current mirror bias circuit, and wherein the first and second transistors in combination form a high impedance constant current source, the emitter of the second transistor being coupled to the collector of the first transistor, the collector of the second transistor supplying a constant current to another circuit.

15. The method of claim 13 wherein the first and second transistors are lateral PNP transistors in an integrated circuit.

16. The method of claim 15 including providing an annular collector region in the second transistor and also providing an emitter region surrounded by and spaced from the annular collector region, providing an oxide layer extending over a portion of the collector region and a portion of the emitter region, and also including a metal field plate means disposed on the oxide layer and making electrical contact to the collector of the second transistor for extending inwardly over the oxide layer toward the emitter region to cover a substantial portion of the collector-base junction of the second transistor and to cover enough of the base region between the collector region and the emitter region to cause the collector depletion region of the second transistor to extend to the emitter region when the magnitude of the collector-to-emitter voltage of the second transistor exceeds a predetermined level.

17. The method of claim 16 wherein the magnitude of the $BV_{CBO}$ breakdown voltage of the second transistor is greater than the sum of the magnitudes of the punch-through voltage of the second transistor and the $BV_{CEO}$ breakdown voltage of the first transistor.

18. The method of claim 17 wherein the predetermined level is approximately equal to the punch-through voltage of the second transistor.

19. The method of claim 18 wherein the metal field plate means extends outwardly over the oxide to cover the outermost portion of the collector-base junction of the second transistor, to thereby increase the $BV_{CBO}$ breakdown voltage of the second transistor, to thereby increase the $BV_{CBO}$ breakdown voltage of the second transistor.

* * * * *